(12) United States Patent
Naseem et al.

(10) Patent No.: US 10,177,264 B2
(45) Date of Patent: Jan. 8, 2019

(54) METHODS OF CAPTURING AND ALIGNING AN ASSEMBLY OF NANOWIRES

(71) Applicant: SOL VOLTAICS AB, Lund (SE)

(72) Inventors: Umear Naseem, Lund (SE); Johan Borgström, Lund (SE); Jaime Castillo-Léon, Lund (SE); Per Viklund, Lund (SE)

(73) Assignee: SOL VOLTAICS AB, Lund (SE)

( * ) Notice: Subject to any disclaimer, the term of this patent is extended or adjusted under 35 U.S.C. 154(b) by 0 days.

(21) Appl. No.: 15/307,338

(22) PCT Filed: Apr. 28, 2015

(86) PCT No.: PCT/IB2015/053094
§ 371 (c)(1),
(2) Date: Oct. 27, 2016

(87) PCT Pub. No.: WO2015/166416
PCT Pub. Date: Nov. 5, 2015

(65) Prior Publication Data
US 2017/0047460 A1 Feb. 16, 2017

(30) Foreign Application Priority Data
Apr. 29, 2014 (SE) .................................... 1430057

(51) Int. Cl.
*H01L 31/18* (2006.01)
*H01L 29/20* (2006.01)
(Continued)

(52) U.S. Cl.
CPC ...... *H01L 31/035227* (2013.01); *B82Y 10/00* (2013.01); *B82Y 15/00* (2013.01);
(Continued)

(58) Field of Classification Search
CPC ......... H01L 31/03; H01L 29/06; H01L 31/18; B82Y 10/00; B82Y 15/00; B82Y 40/00; B05D 1/202
(Continued)

(56) References Cited

U.S. PATENT DOCUMENTS 7,105,052 B1 * 9/2006 Schlenoff ............... B82Y 25/00
117/68
2003/0215865 A1 * 11/2003 Mayer .............. G01N 33/54373
435/6.19
(Continued)

FOREIGN PATENT DOCUMENTS

CN 1624210 A 6/2005
WO 2013154490 A2 10/2013

OTHER PUBLICATIONS

Liu, J.W. et al., "A General Strategy for Self-Assembly of Nanosized Building Blocks on Liquid/Liquid Interfaces," Wiley-VCH Verlag GmbH & Co., KGaA, Weinheim, Small vol. 8, No. 15, pp. 2412-2420, (2012).
(Continued)

*Primary Examiner* — Sheikh Maruf
(74) *Attorney, Agent, or Firm* — The Marbury Law Group PLLC

(57) ABSTRACT

A method for transferring an assembly of oriented nanowires from a liquid interface onto a surface including providing a first liquid and a second liquid, wherein the first and second liquids phase separate into a bottom phase, a top phase and an interface between the bottom phase and the top phase, providing nanowires in the first and second liquids such that the majority of the nanowires are located at the interface and providing the nanowires onto a substrate such that a majority of the nanowires are aligned with respect to each other on the substrate.

11 Claims, 5 Drawing Sheets

(51) Int. Cl.
*H01L 29/06* (2006.01)
*H01L 31/0352* (2006.01)
*B82Y 10/00* (2011.01)
*B82Y 15/00* (2011.01)
*B82Y 40/00* (2011.01)
*H01L 29/22* (2006.01)
*B05D 1/20* (2006.01)

(52) U.S. Cl.
CPC .......... *B82Y 40/00* (2013.01); *H01L 29/0676* (2013.01); *H01L 31/184* (2013.01); *H01L 31/1828* (2013.01); *B05D 1/202* (2013.01); *H01L 29/20* (2013.01); *H01L 29/22* (2013.01)

(58) Field of Classification Search
USPC .......... 438/93, 46, 22; 257/76, 103, E31.032
See application file for complete search history.

(56) References Cited

U.S. PATENT DOCUMENTS

| | | | |
|---|---|---|---|
| 2007/0077429 A1* | 4/2007 | Mirkin | B82Y 5/00 428/402 |
| 2010/0320140 A1* | 12/2010 | Nowak | B01D 61/025 210/490 |
| 2011/0023948 A1* | 2/2011 | Wang | B82Y 10/00 136/255 |
| 2011/0155236 A1* | 6/2011 | Goto | H01L 31/02167 136/256 |
| 2013/0256689 A1* | 10/2013 | Pougeoise | H01L 31/022408 257/76 |
| 2014/0327037 A1* | 11/2014 | Dussaigne | H01L 21/0237 257/103 |
| 2015/0102284 A1* | 4/2015 | Garting | B82Y 10/00 257/9 |
| 2015/0194549 A1* | 7/2015 | Weman | H01L 31/02246 136/244 |
| 2015/0280053 A1* | 10/2015 | Gilet | B82Y 40/00 438/46 |

OTHER PUBLICATIONS

Wang, J. et al., "Stepwise Directing of Nanocrystals to Self-Assemble at Water/Oil Interfaces," Angew. Chem. Int. Ed., vol. 45, pp. 7963-7966, (2006).

Zhang, S.H. et al., "Co-assembled thin Ilms of Ag nanowires and functional nanoparticles at the liquid-liquid interface by shaking," The Royal Society of Chemistry 2013, Nanoscale, vol. 5, pp. 4223-4229, (2013).

International Search Report and written Opinion for PCT/IB2015/053094 dated Jul. 27, 2015.

Chengyi Zhang et al.: "Facile One-Step Fabrication of Ordered Organic Nanowire Films" Advanced Materials, vol. 21, No. 41, Nov. 6, 2009 (Nov. 6, 2009), pp. 4172-4175.

Alla Petukhova et al: "Standing Arrays of Gold Nanorods End-Tethered with Polymer Ligands" SMALL, vol. 8, No. 5, Mar. 12, 2012 (Mar. 12, 2012), pp. 731-737.

Hong-Yan Shi 1 et al: "Ordering of Disordered Nanowires: Spontaneous Formation of Highly Aiigned, Ultralong Ag Nanowire Films at Oil-Water-Air Interface", Advanced Functional Materials, Wiley-V C H Verlag GMBH & Co. KGAA, DE, vol. 20, No. 6, Mar. 24, 2010 (Mar. 24, 2010), pp. 958-964.

Wang M C P et al: "Directed assembly of nanowires", Materials Today, Elsevier Science, Kidlington, GB, vol. 12, No. 5, May 1, 2009 (May 1, 2009), pp. 34-43.

International Preliminary Report on Patentability and Written Opinion of the International Searching Authority for International Application No. PCT/IB2015/053094 dated Nov. 10, 2016, 11 pages.

First Office Action from the China National Intellectual Property Administration, for PRC (China) Patent Application No. 201580028477.3, dated Nov. 5, 2018, 10 pages.

* cited by examiner

METHODS OF CAPTURING AND ALIGNING AN ASSEMBLY OF NANOWIRES

CROSS-REFERENCE TO OTHER APPLICATIONS

The present application is a national phase application under 35 U.S.C. § 371 of international application PCT/IBI5/053094, filed Apr. 28, 2015 which is related to and claims priority to Swedish Application No. 1430057-8, filed Apr. 29, 2014, the entire contents of which are incorporated by reference herein.

FIELD

The present invention relates to the formation of nanowire devices and in particular to capturing and aligning of nanowires to make nanowire devices.

BACKGROUND

Conventional technologies for capturing nanostructures on a surface focus on the alignment and capture/deposition of nanostructures with a low length/diameter ratio (e.g.: nanorods, nanoparticles). However, capture and alignment of nanostructures with appreciable length/diameter ratio (e.g. nanowires) is more difficult. It is also difficult to align nanowires with a preferential direction. Conventional technologies use external controls (e.g., applied electric fields, slow solvent evaporation or thermal annealing) which may require the use of external equipment or high voltages to obtain the alignment and capture/deposition of nanostructures. These external controls increase the production cost and decrease the scalability of nanowire device production.

SUMMARY

An embodiment is drawn to a method for transferring an assembly of oriented nanowires from a liquid interface onto a surface including providing a first liquid and a second liquid. The first and second liquids phase separate into a bottom phase, a top phase and an interface between the bottom phase and the top phase. The method also includes providing nanowires in the first and second liquids such that the majority of the nanowires are located at the interface and providing the nanowires onto a substrate such that a majority of the nanowires are aligned with respect to each other on the substrate.

DETAILED DESCRIPTION

An embodiment of the method uses a first liquid located in a container and a nanowire dispersion that is added to the first liquid. The nanowire dispersion is made by dispersing pre-fabricated nanowires in a dispersion liquid. That is, the nanowires are fabricated prior to being added to the dispersion fluid in contrast to in-situ formed nanowires in the dispersion fluid. In this embodiment, the dispersion liquid is selected such that the nanowire dispersion is immiscible or only partially miscible in the first liquid. In this manner, when the nanowire dispersion is added to the first liquid, the first liquid and the dispersion liquid phase separate, creating a two phase liquid system. The denser liquid settles to the bottom of the container forming a bottom phase, while the less dense liquid floats on top of the first liquid creating a top phase. The resulting two phase system has a top phase and a bottom phase and an interface between the top phase and the bottom phase.

In an embodiment, the nanowires in the nanowire dispersion may be made of the same material. Alternatively, the nanowire dispersion may include nanowires made of different materials. Nanowire materials suitable for use in the present embodiment and the embodiments below include metals (such as gold silver and alloys thereof), carbon nanowires or nanotubes (single wall and multiwall), semiconductors, including III-V (including binary, ternary and quaternary III-V semiconductors made of Al, In, Ga, N, P, As, such as GaAs and InP) and II-VI semiconductors (including binary, ternary and quaternary II-VI semiconductors made from Zn, Cd, Se, O, S, Te, such as ZnO, CdSe) and ceramics. The nanowires may be used as received or be subjected to one or more surface treatments described in more detail below.

After adding the nanowire dispersion to the first liquid, the majority of the nanowires are then assembled at the interface. Typically, the nanowires spontaneously assemble at the interface, that is, the nanowires self-align at the interface, if given sufficient time. However, the nanowires may be subjected to one or more conditions that promote or accelerate the assembly of the nanowires at the interface. Acceleration may be accomplished in several ways. For example, acceleration may be accomplished by changing the composition of the top phase, the composition of the bottom phase or altering the temperature of the container.

Figure 2:
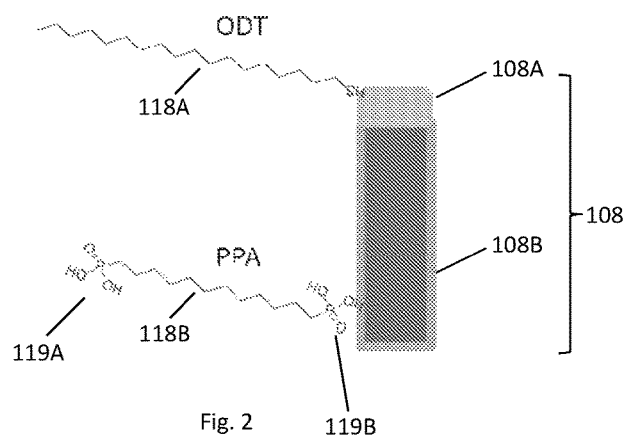
FIG. 2 is a schematic illustration of a functionalized nanowire according to an embodiment.
Figure 3:
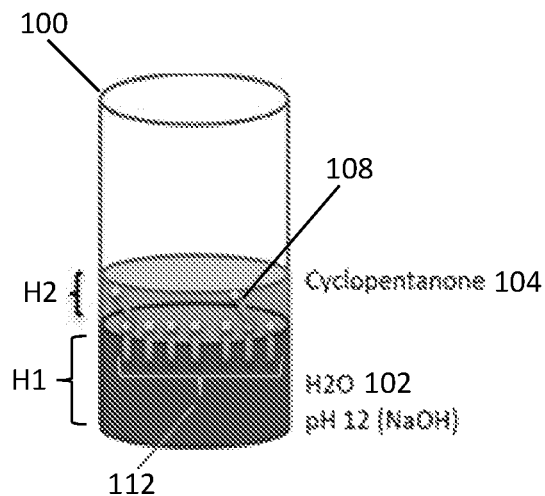
FIG. 3 is a schematic illustration of a method of aligned and assembled nanowires according to another embodiment.
Figure 4:
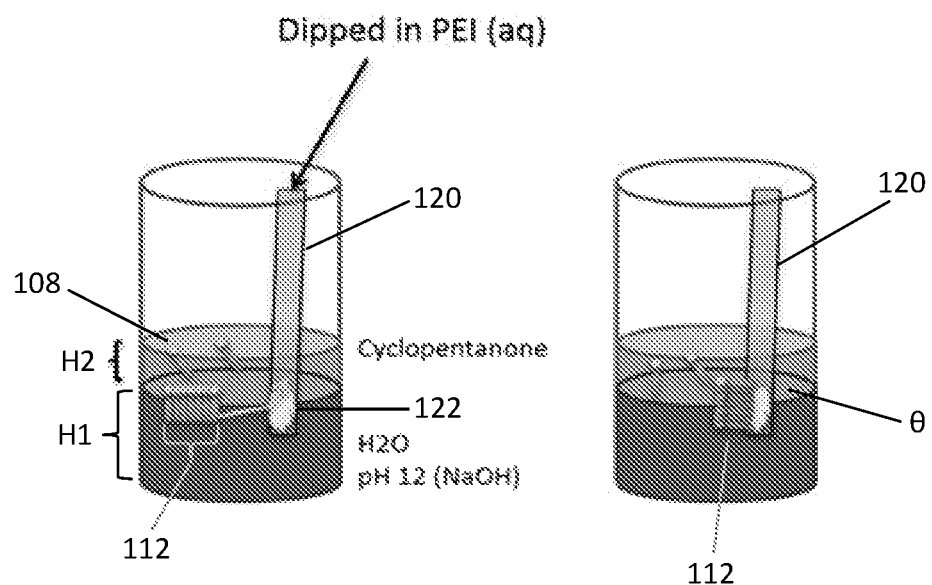
FIG. 4 is a schematic illustration of a method of capturing and aligning an assembly of nanowires according to another embodiment.

In an embodiment, the top phase of the two phase system is thicker (e.g. the top phase has a height H2 as illustrated in FIGS. 2-4 that is greater than the length of the nanowires) than the length of the nanowires in the top phase of the two phase system. Optionally, the top phase may be partially or completely removed from the container prior to transferring the nanowires to a substrate.

After forming the assembly of aligned nanowires at the interface, the assembly of aligned nanowires may be transferred from the container to a substrate. In an embodiment, the surface of the substrate is functionalized. The functionalizing compound aids in securing the nanowires to the substrate surface. In an embodiment, transfer is accomplished by bringing the functionalized surface in contact with the nanowire assembly at the interface by moving the functionalized surface of the substrate across the interface. The substrate may be oriented vertically, horizontally or inclined at an angle relative to the liquid interface.

The surface of the substrate may be modified (e.g. functionalized) either by chemical reactions or physical adsorption of a functional species that includes specific functional groups. Alternatively, the substrate surface may be used as-received (i.e. bare). Example substrates that may be used include, but are not limited to, silicon, molybdenum, silane modified silicon, gold, thiol modified gold or silicon surfaces with physically adsorbed cationic polymers.

In another embodiment, rather than adding the nanowire dispersion to the first liquid, the two phase liquid system is formed first followed by adding nanowires to the system. Thus, a second liquid, different from the first liquid, may be added to the first liquid. Preferably, the second liquid is immiscible or partially miscible/partially immiscible in the first liquid. In this manner and similar to the previous embodiment, when the second liquid is added to the first liquid, the two liquids phase separate, creating a two phase liquid system. The denser liquid settles to the bottom of the container, while the less dense liquid floats on top of the first liquid, resulting in a two phase system with a top phase, a bottom phase and an interface between the top and bottom phases. In this embodiment, the nanowires or a nanowire dispersion may be added to the two phase system or added to the first liquid prior to adding the second liquid to the first liquid. A nanowire dispersion comprises nanowires distributed in a dispersion liquid (e.g. a solvent). The dispersion liquid may be the same as either the first liquid or the second liquid. Alternatively, the dispersion liquid may be a third liquid that is different from both the first and second liquids. Alternatively, dry nanowires may be added.

Based on the choice of functionalizing compounds and the type and composition of the liquids (e.g. the first liquid, the dispersion liquid and second liquid and additives (if used)), the orientation and alignment of the nanowires may be controlled. In a similar manner, these parameters/compositional variables may allow the nanowire-nanowire interspacing to be varied, resulting in assemblies with different (i.e. pre-selected) densities (e.g. density of nanowires per square micron). The nanowire-nanowire interspacing can be deduced from the percentage of surface area covered after the capture of the aligned nanowires on the substrate.

In an embodiment, the method includes an additional step of immobilizing the nanowire assembly. In this embodiment, a solidification agent is added to the container with the nanowire assembly that causes the liquid of the top phase or the bottom phase to solidify. In an embodiment, the solidified phase is a soft layer (e.g. a gel or flexible solid layer) that traps the nanowires. Alternatively, if the top liquid phase is completely removed, a liquid may be added that causes the liquid of the bottom phase to solidify and hold the nanowire assembly. In another alternative embodiment, one of the liquids may be exposed to radiation (e.g. thermal or electromagnetic radiation, such as visible or UV) to solidify either the top or the bottom phase. In another embodiment, the first liquid, the dispersion liquid or the second liquid is a liquid that solidifies by itself with time. In this manner, the nanowires may be immobilized in the top (or bottom) phase. In another embodiment, if the top liquid phase is significantly removed, a liquid may be added that when in contact with the bottom liquid phase, solidifies and holds the nanowire assembly.

In an embodiment, the nanowires aligned at the interface between the top and bottom phases, preferably with the long axis of the nanowires substantially perpendicular to the interface surface, are transferred as-aligned to a functionalized substrate by positioning the functionalized surface of the substrate in contact with the aligned nanowire assembly at the interface. The assembly of nanowires may be transferred from the interface to the functionalized substrate surface as a result of electrostatic interactions between the aligned nanowires and the functionalized surface or as a result of van der Waals interactions between the nanowires and the functionalized surface.

A parameter that may be considered when selecting a functionalizing compound is the wetting properties of the functionalized surface in the nanowire transfer/capture step. The substrate surface should be suitably wetted by the first liquid. That is, the functionalized substrate surface should allow the transfer of the nanowire assembly to occur spontaneously (i.e. without assistance) and at a high speed. In an embodiment, the first liquid may have a contact angle less than about 130 degrees on the functionalized surface. Preferably, the contact angle is less than 90 degrees, such as 0 to 75°. Preferably, the wetting of the functionalized substrate surface is facilitated in the presence of the nanowire assemblies. In certain capture geometries, a high contact angle (e.g. >90°) between the first and/or second liquid and the functionalized surface can be desirable. In particular, if the functionalized surface is brought in contact with the nanowire assembly from above and the functionalized surface is practically parallel to the liquid interface. In this situation, the functionalized surface never really cross the liquid interface and instead, merely picks up the nanowire assembly from one side of the liquid interface.

In an embodiment, the nanowires may be functionalized with either compounds that render the nanowires hydrophobic (including alkanes, fluoro-compounds (such as Pentanethiol, perfluorodecane thiol, dodecyltrichlorosilane, stearic acid, decyl phosphonic acid, 5-(1,2-dithiolan-3-yl)-N-dodecylpentanamide, sodium dodecyl sulfate, triphenyl phosphine, octadecylthiol)) and/or hydrophilic (including sulphates, phosphates, carboxylates, amines, polyethers, (such as sodium mercaptopropane sulfonate, sodium mercaptoethane sulfonate, mercaptoalkane succinate (2-mercaptosuccinate), mercaptoalkane amine, (11-mercaptoundecyl)-N,N,N-trimethylammonium bromide, (12-Phosphonododecyl)phosphonic acid, (±)-1,2-Dithiolane-3-pentanoic acid, (2-Ammonioethyl)di-tert-butylphosphonium bis(tetrafluoroborate), (3-Aminopropyl) triethoxysilane, 12-mercaptododecanoic acid)). In an embodiment, one part of the nanowire surface is rendered hydrophobic and the other part of the nanowire surface is rendered hydrophilic using different functionalizing compounds to achieve the vertical alignment at the liquid interface. In an alternative embodiment, only one part of the nanowire surface is treated with a functionalizing compound.

Figure 1:
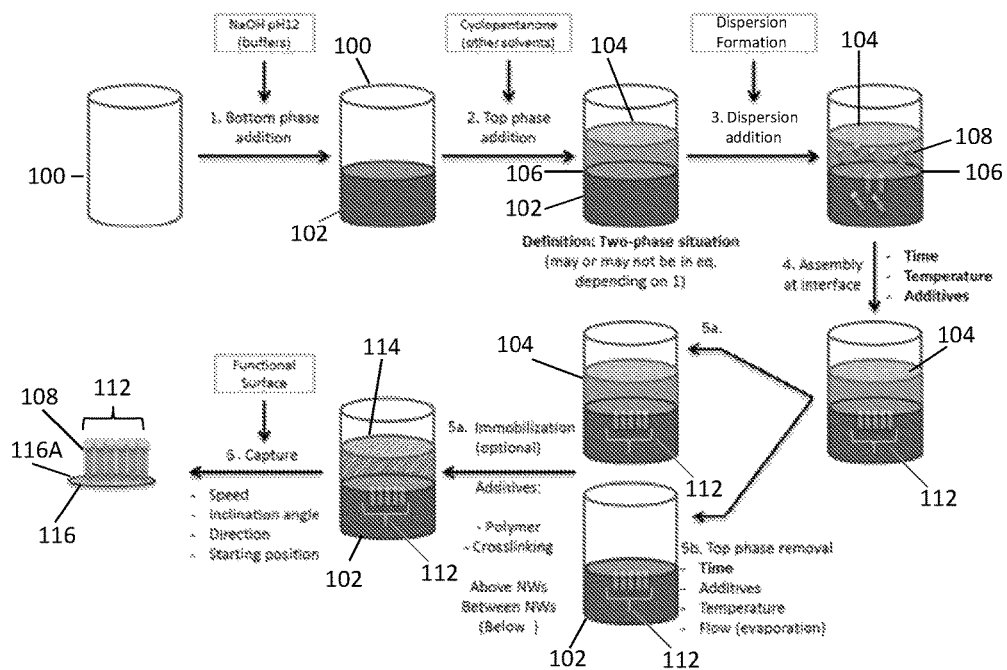
FIG. 1 is a schematic illustration of a method of capturing and aligning an assembly of nanowires according to an embodiment.

FIG. 1 illustrates of a method of capturing and aligning an assembly of nanowires according to an embodiment. In a first step 1 of this embodiment, a first liquid is put in a container 100 to form the bottom phase 102. Any liquid holding container 100 may be used, such as a beaker, jar, barrel, etc. In an embodiment, the first liquid is an aqueous basic solution (pH greater than 7), such as a NaOH solution or another basic solution. The pH of the solution may be in a range of 9-13, such as 10-12. Optionally, one or more buffers may be added to the first liquid. In a second step 2, a second liquid is added to the container 100 to form the top phase 104. As discussed above, the first and second liquids are selected so that they phase separate and form an interface 106 between the top 104 and bottom 102 phases. In an embodiment, the top phase 104 comprises a liquid such as cyclopentanone which is immiscible or only partially miscible/partially immiscible with the bottom phase 102.

In a third step 3, a nanowire dispersion comprising pre-fabricated nanowires 108 dispersed in a dispersion fluid is added to the container 100. The pre-fabricated nanowires 108 are fabricated outside of the top phase 104 and the bottom phase 102. For example, the pre-fabricated nanowires 108 may be fabricated in-situ in the dispersion fluid prior to adding the nanowires dispersion to the top 104 and bottom 102 phases or fabricated prior to being added to the dispersion fluid and then added to the dispersion fluid. The nanowires 108 in the nanowire dispersion have a random orientation when initially added to the container 100 and may be found in both the bottom 102 and top 104 phases. Optionally, the nanowires 108 may be functionalized as described above. In a fourth step 4, the nanowires 108 are provided to the interface and are preferably aligned/assembled at the interface to form an assembly 112 of nanowires 108. As discussed above, the liquid used to form the nanowire dispersion may be the same as either the first or second liquid or be different from either the first or the second liquids.

As illustrated in FIG. 1, in one embodiment, a majority of the nanowires 108 in the container 100 are located at the interface 106. Preferably at least 50% of the nanowires 108 (such as 50-100%, such as more than 70%, such as 75-99%, such as more than 80%, such as 90-99%) in the container 100 are located at the interface 106, while no nanowires or a minority of the nanowires are located in the first and/or the second liquid away from the interface.

Preferably, a majority of the nanowires 108 in the container 100 align (e.g. self align) to form the assembly 112 of nanowires 108 at the interface 106. Preferably at least 50% of the nanowires 108 (such as 50-100%, such as more than 70%, such as 75-99%, such as more than 80%, such as 90-99%) in the container 100 align (are oriented unidirectionally with respect to each other) to form the assembly 112 of nanowires 108 at the interface 106. A minority of the nanowires 108 located at the interface 106 may be randomly oriented or aligned in a direction different from the unidirection shared by the majority of the nanowires at the interface or be arranged randomly without preferred orientation.

Preferably, the majority of the nanowires 108 aligned at the interface 106 are aligned substantially perpendicular, such as within 20°, such as within 10° of perpendicular, to the interface 106 with the same end (e.g. the catalyst particle end) pointing up. One part (e.g., lower part) of the nanowires 108 is located in liquid 102 and another part (e.g., upper part) of the nanowires 108 is located in liquid 104.

Alternatively, the majority of the nanowires 108 in the container 100 located at the interface 106 may be aligned in a direction which is not substantially perpendicular to the interface 106, (e.g. at an angle between 0 and 89 degrees with the interface 106) or may be located in a random orientation at the interface.

However, it is not necessary that all of the nanowires 108 in the container 100 align to form the assembly 112. The minority of the nanowires not located at the interface 106 may be randomly oriented or aligned in a direction which is the same or different from the unidirection direction shared by the majority of the nanowires at the interface.

As discussed above, alignment/assembly may occur with the simple passage of time. However, the alignment/assembly of the nanowires may be assisted with the addition of additives to the bottom 102 and/or top 104 phases. Alternatively, the temperature of the system (e.g. the container 100, top 104 and bottom 102 phases and the nanowires 108) may be changed (either lowered or raised as desired) to expedite alignment/assembly of the nanowires 108.

Two alternative 5a, 5b are illustrated for the optional fifth step. In the first option 5a, the top or bottom phase 102, 104 is treated to solidify the phase and thereby immobilize the nanowires 108 within. As discussed above, solidification may be accomplished by adding a solidification agent (e.g., a polymer or a precursor, such as a monomer) to the top or bottom phase 102, 104 followed by irradiating or heating the top or bottom phase 102, 104 to cross-link the precursor to form nanowires embedded in a polymer. Alternatively, the solidification may be achieved by removing any solvent from the polymer-containing phase/layer, i.e. without chemical crosslinking. That is, the polymer containing phase solidifies as the solvent evaporates, resulting in a hardened layer.

In an alternative option 5b, the top phase 104 is partially or fully removed. The top phase 104 may be removed by the passage of time (e.g., evaporation or by dissolution into the bottom phase 102), by the assistance of additives, by raising the temperature of the liquids (to speed up evaporation) or by decanting. In this manner, one end of the nanowires is exposed (i.e. not fully immersed in the top phase 104).

In step 6, the assembly 112 of nanowires 108 is transferred to (captured on) a substrate 116. In an embodiment, the capture surface 116A of the substrate 116 is functionalized to aid in securing the assembly 112 of nanowires 108. In an embodiment, the substrate 116 is submerged below the nanowire assembly 112 and oriented such that the capture surface 116A of the substrate 116 is parallel to the interface 106 (i.e. the capture surface 116 is perpendicular to the nanowires 108). The substrate 116 is then slowly lifted to contact the assembly 112 of nanowires 108. If the top or the bottom phase is solidified as described above, then the solidified phase is removed from the container on the capture surface of the substrate together with the nanowire assembly.

In an alternative embodiment, the substrate 116 is dipped into the first and second liquids at an angle θ to the interface 106 between the top 104 and bottom 102 phases. Contact is then made between the capture surface 116A of the substrate 116 and the assembly 112 of nanowires 108. The substrate 116 may then be slowly dragged through and/or withdrawn from the first and/or second liquids (only the first liquid if step 5b is followed) with the nanowires 108 perpendicular to the capture surface 116A. In general, the speed of substrate withdrawal, the inclination angle, the direction of withdrawal and/or the starting position may be varied to enhance the nanowire assembly attachment to the capture surface and withdrawal from the container.

Preferably, when the assembly 112 of nanowires 108 is transferred to the substrate 116, at least 50% of the nanowires 108 (such as 50-100%, such as more than 70%, such as 75-99%, such as more than 80%, such as 90-99%) are aligned with respect to the surface of the substrate. Thus, the majority of the nanowires 108 at the interface 106 may aligned with respect to each other (e.g. perpendicular or non-perpendicular to the interface 106) or be randomly arranged with respect to each other. However, when the nanowires are transferred to the substrate 116, the majority of the nanowires are aligned with respect to each other and with respect to the capture surface 116A of the substrate 116, such as substantially perpendicular (e.g., −20 to 20 degrees, such as −10 to 10 degrees such as 0 degrees) to the capture surface 116A. In an embodiment, the nanowires 108 are aligned with the nanoparticle 108A containing side of the nanowire 108 distal from the capture surface 116A of the substrate 116. Alternatively, the nanowires 108 are aligned with the nanoparticle 108A containing side of the nanowire 108 proximal to the capture surface 116A of the substrate 116. Thus, in an embodiment, less than 50% of the nanowires 108 may be aligned at the liquid/liquid interface 106 but more than 50% of the nanowires 108, (such as more than 70%, such as more than 80%) of the nanowires 108 are aligned on the substrate 116.

FIG. 2 is a schematic illustration of a functionalized nanowire 108 according to an embodiment. As illustrated in FIG. 2, the nanowire 108 includes a nanoparticle 108A, such as a gold nanoparticle, at one end of the nanowire 108. The nanoparticle 108A may be a result of the growth process of the wire portion 108B (e.g. semiconductor portion) of the nanowire 108, such as when growing nanowires 108 by the vapor-liquid-solid (VLS) process using the nanoparticle 108A as a catalyst seed. Example processes for making nanowires 108 can be found in U.S. provisional application 61/623,137 filed on Apr. 12, 2012 and PCT published application number WO13/154490 A2, hereby incorporated by reference in their entirety. In an embodiment, a first functionalizing compound 118A is attached to one end of the nanowire 108, such as to the nanoparticle 108A. A second, different functionalizing compound 118B may be attached to the second end of the nanowire that lacks the nanoparticle 108A. The functionalizing compounds 118A, 118B aid in aligning the nanowires 108 in the top 104 and bottom 102 phases. As discussed in more detail below in regards to specific examples, one of the functionalizing groups may be 1-octadecanethiol (ODT) while the other may be (12-phosphonododecyl)phosphonic acid (PPA). Further, one (or both) of the functionalizing compounds 118A, 118B may have one functional group or two functional groups, for example functional groups 119A, 119B on both ends of the functionalizing compounds 118A, 118B. That is one (or both) of the functionalizing compounds 118A, 118B may have one functional group or two functional groups 119A, 119B one or both ends of a spacer arm/backbone. Alternatively, one (or both) of the functionalizing compounds 118A, 118B may have only one functional group 119A (119B). One functional group 119B may be attached to the nanowire 118, while the other functional group 119A is available to bond to the capture surface 116A of the substrate 116. In an embodiment, the substrate capture surface 116A (e.g. a Si substrate surface) is functionalized with a compound carrying an opposite charge to that of the functionalizing compound 118B (e.g. PPA) attached to the second end (e.g., the end that lacks the nanoparticle 108A) of the nanowire 108.

In one embodiment, a "functionalizing compound" comprises a surface affixing functional group 119B (called "anchor") and further may comprises a second functional group 119A that gives the compound its specific properties. Table I below lists different kinds of anchor groups as well as different kinds of second functional groups and backbones. Some non-limiting, exemplary combinations of anchors and second functional groups as well as backbones are shown in the examples column. Exemplary solvents are also listed in the last row of Table I.

TABLE I

Functionalizing Compounds

| Type of functionalization | "Anchor" | Second Functional Group | Examples |
|---|---|---|---|
| Renders surface hydrophilic | Thiol, Carboxylate, Phosphate, Disulfide, Silane, Sulfonate, | sulphate, phosphate, carboxylate, amine, polyether, alcohol | sodium mercaptopropane sulfonate, sodium mercaptoethane sulfonate, marcaptoalcane succinate (2-mercaptosuccinate), mercaptoalkane amine, |

TABLE I-continued

Functionalizing Compounds

| | Phosphine N-heterocyclic carbene | | (11-mercaptoundecyl)-N,N,N-trimethylammonium bromide, (12-Phosphonododecyl)phosphonic acid, (±)-1,2-Dithiolane-3-pentanoic acid (also known as lipoic acid), (2-Ammonioethyl)di-tert-butylphosphonium bis(tetrafluoroborate), (3-Aminopropyl)triethoxysilane, 12-mercaptododecanoic acid NHS ester |
|---|---|---|---|
| Type of functionalization | "Anchor" | Backbone | Examples |
| Renders surface hydrophobic | Thiol, Phosphate, Carboxylate, Disulfide, Silane, Sulfonate, Phosphine, N-heterocyclic carbene | Alkane, Fluoro-compound | Pentanethiol, Perfluorodecane thiol, Dodecyltrochloro silane, stearic acid, decyl phosphonic acid, 5-(1,2-dithiolan-3-yl)-N-dodecylpentanamide, sodium dodecyl sulfate, triphenyl phosphine, octadecylthiol |
| Solvents | Methyl isobutylketone, methyl isopropylketone, acetonitrile, diethyl ether, butanol, hexanol, ethanol, cyclopentanone, cyclohexanone butyl acetate, chloroform, dichloromethane, perfluoropolyether (PFPE), toluene, pentane, hexane, heptane, water | | |

In Table I above, any suitable combination of solvent, charged functionalizing compound and non-charged functionalizing compound may be used. Furthermore, any suitable anchor and functional group combination may be used in the charged or non-charged compounds in addition to the exemplary compounds listed in Table I. Functionalizing compounds suitable for nanowire assembly and capture are also described in U.S. Provisional Application No. 61/623, 137, filed Apr. 12, 2012, hereby incorporated by reference in its entirety.

Furthermore, a functionalizing polymer can be used instead of functionalizing compounds 118A, 118B. The functionalizing polymer may comprise multiple surface affixing functional groups 119B (called anchor groups) that attach to the nanowire surface. In another embodiment, the functionalizing polymer does not contain any anchor groups 119B, but has multiple functional groups (such as alcohols or amines), that may interact with the nanowire surface (e.g. adsorb). In another embodiment, the polymer has neither anchor groups nor functional groups. Instead the polymer has a backbone that is able to interact with the nanowire surface (e.g. polyethylene oxide). This backbone may comprise one type of monomer or several different polymers, in any known configuration, such as alternating copolymers, periodic copolymers, statistical copolymers, random copolymers, block copolymers, grafted copolymers.

Figure 5:
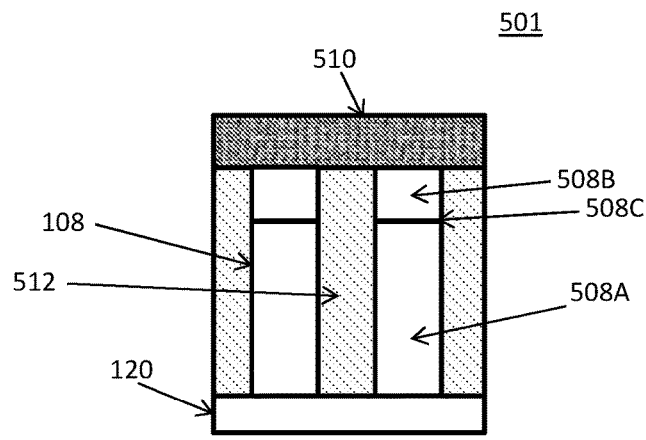
FIG. 5 is a schematic side cross sectional view of a solar cell according to an embodiment.

In an embodiment, the substrate 116 with the captured assembly 112 of nanowires 108 can be placed into a solar cell 501 if the nanowires 108 have a pn junction 508A, as shown in FIG. 5. For example, as schematically illustrated in FIG. 5, the substrate 120 contains semiconductor (e.g., GaAs, InP, etc.) nanowires 108 positioned substantially perpendicular (e.g., with the longest axis 80 to 100 degrees, such as 90 degrees) to upper capture surface of the substrate.

The nanowires 108 in this embodiment have an axial pn junction 508C located between a lower first conductivity type (e.g., n or p type) segment 508A and an upper second conductivity type (e.g., p or n type) segment 508B of the opposite conductivity type. In the solar cell 501, electrodes provide electrical contact to the nanowires 108. For example, the solar cell 501 may contain an upper electrode (e.g., transparent electrode) 510 in electrical contact with the upper segment 508B of the nanowires and an electrically conductive or semiconductor substrate 520 may provide an electrical contact to the lower segment 508A of the nanowires. An insulating or encapsulating material 512 may be located between the nanowires 108. Alternatively, the nanowires may contain a radial rather than an axial pn junction, in which case segment 508B is formed as a shell surrounding a nanowire core 508A such that the pn junction extends substantially perpendicular to the substrate capture surface.

FIG. 3 is a schematic illustration of aligned and assembled nanowires according to an exemplary embodiment. In this example, a glass container was filled with 5000 µl of an aqueous liquid of pH 12.2 adjusted using NaOH to form the bottom phase 102 having a thickness H1. Then, 1000 µl cyclopentanone was added to form the top phase 104 having a thickness H2. An arbitrary amount of a nanowire dispersion of nanowires 108 in cyclopentanone was then added. The nanowires 108 were allowed to spontaneously assemble at the interface 106. The glass container 100 was rapidly cooled.

The assemblies 112 of nanowires 108 were transferred by immersing a substrate 116 with a functionalized capture surface 116A into the liquids and moving it through the liquid interface from below, while keeping the functionalized capture surface 116A inclined at a near vertical orientation ($\theta$>60 degrees inclination, such as 65-115 degrees) to the interface 106. The functionalized capture surface 116A was prepared by coating a piece of silicon wafer in an aqueous solution of polyethyleneimine. The functionalized surface with transferred assemblies 112 of nanowires 108 was then dried at ambient conditions.

FIG. 4 is a schematic illustration of capturing and aligning an array of nanowires according to another embodiment. In this embodiment, a substrate 116 with a functionalized capture surface 116A is dipped into the liquid/liquid two-phase system. The assemblies 112 of nanowires 108 are captured on the capture surface 116A of the substrate 116 as the substrate 116 is withdrawn from the liquid/liquid two-phase system.

In an embodiment, 5000 µl of aqueous NaOH adjusted to pH 12.2 was added to a container 100. Then, 1000 µl of cyclopentanone was added to establish a liquid/liquid two-phase system (i.e. bottom phase 102 and top phase 104). An arbitrary amount of a nanowires 108 dispersed in cyclopentanone was gently added. The glass container 100 was rapidly cooled resulting in formation of assemblies 112 of nanowires. The majority of the remaining top phase 104 was then manually removed.

The interfacial assemblies 112 of nanowires 108 were transferred by lowering a substrate 116 with a functionalized capture surface 116A onto the liquid until contact was made with the assemblies 112. Then, the substrate 116 was pulled up from the interface while keeping the functionalized capture surface 116A parallel to the liquid interface, analogous to the Langmuir-Schaefer method. The functionalized capture surface was prepared by coating a piece of silicon wafer in a polymer that solidifies upon contact with the bottom phase (e.g. a thickening polymer), thereby immobilizing the assemblies 112 of nanowires 108. The functionalized capture surface 116A with the transferred assemblies 112 of nanowires 108 was dried at ambient conditions.

In another embodiment, bare (i.e. non-functionalized) nanowires 108 are first provided. The ends of the nanowires 108 are then functionalized with different functionalizing compounds 118A, 118B at opposing ends of the nanowires 108. One end may be functionalized with ODT while the other end may functionalized with PPA. The nanowires 108 may then be cleaned with ethanol, acetone and purified water. Then the nanowires 108 may be transferred to another liquid for further processing, handling or storage for later use.

In another embodiment, the nanowires 108 are functionalized prior to assembly at the interface 106. The nanowires 108 may be functionalized with different functionalizing compounds 118A, 118B at opposing ends of the nanowires 108 to create one segment that has hydrophilic characteristics and another segment that has hydrophobic characteristics (i.e. amphiphilic nanowires). In an embodiment, amphiphilic nanowires may be made by using nanowires 108 having two different material surfaces, for example, GaAs nanowire portions 108B grown from a Au nanoparticle seed 108A. The Au nanoparticles 108A may be treated (e.g. functionalized) with a functionalizing compound that increases its hydrophobicity in relation to the GaAs surface. In addition, a second chemical can be used to increase the hydrophilicity of the wire portion 108B of the GaAs surface, further enhancing the amphiphilic characteristics of the nanowires.

In an embodiment, the nanowires 108 are oriented in such a way that their longest dimension (i.e. the nanowire length along the longest axis) is positioned perpendicular to the liquid interface 106. This orientation may be obtained, for instance, due to the interaction between the nanowire functionalization and the top and bottom liquid phases 102, 104.

In an example, a glass vessel (with a liquid surface area of 4.5 cm$^2$) was used as container 100 and an aqueous solution of NaOH was used for the bottom phase 102. The pH of the bottom phase 102 was adjusted to 12. The functionalized capture surface 116A used in this example was a piece of a silicon wafer crossing the liquid interface 106 at an approximate angle of 70 degrees. Subsequent to adding the bottom phase 102 to the container 100, 300 µl of a newly sonicated nanowire dispersion including functionalized GaAs nanowires 108 in cyclopentanone was gently added onto the air-liquid interface of the bottom phase 102. There, it formed a separate top phase 104. The nanowires 108 spontaneously assembled at the interface 106 between the top 104 and bottom 102 phases. After approximately 10 minutes, the functionalized capture surface 116A was elevated horizontally through the interface 106, transferring the assembly 112 of nanowires 108 from the interface 106 to the functionalized capture surface 116.

In another example, a hydrophobically modified silicon wafer was used as functionalized capture surface 116A. The functionalized capture surface 116A was prepared by sputtering a thin layer of titanium followed by a thin layer of gold onto a silicon wafer substrate 116. The gold sputtered wafer 116 was then immersed in a solution of 1-octadecanethiol in ethanol for at least 1 hour. This functional surface was then used to capture a nanowire assembly 112 from a similar experiment as the one above with the following differences. After about 20 minutes, transfer to the functionalized capture surface 116A was performed by lowering a hydrophobically modified substrate 116 down into the liquid interface 106 in a nearly horizontal orientation ($\theta$<20 degrees inclination, such as 0-15 degrees) until the entire capture surface 116A was covered by the liquid. The functionalized capture surface 116A was then raised slowly and allowed to dry. In an embodiment, if the substrate has a hydrophobic capture surface 116A, then this surface is maintained substantially parallel (e.g., −10 to 10 degrees, such as 0 degrees) to the interface 106. In contrast, if the substrate has a hydrophilic capture surface 116A, then is surface is maintained substantially perpendicular (e.g., 80 to 100 degrees, such as 90 degrees) to the interface 106.

In another example, a glass container was used and the bottom phase 102 was an aqueous solution in which the pH was adjusted to 12.5 using NaOH. The experiment was performed at a temperature of 14° C. The procedure included the addition of a second liquid: 265 µl cyclopentanone. Four minutes later 177 µl of a nanowire dispersion in cyclopentanone was added using a Hamilton syringe. A silicon substrate 116 was used as a capture surface 116A in this example. Eighteen minutes after the addition of the second liquid, the interfacial assemblies 112 of nanowires 108 were transferred by immersing the substrate 116 into the liquids and moving it through the liquid interface 106 from below, while keeping the capture surface 116A inclined relative to the liquid interface 106. The capture surface 116A with transferred assemblies 112 of nanowires 108 was dried at ambient conditions.

Figure 6:
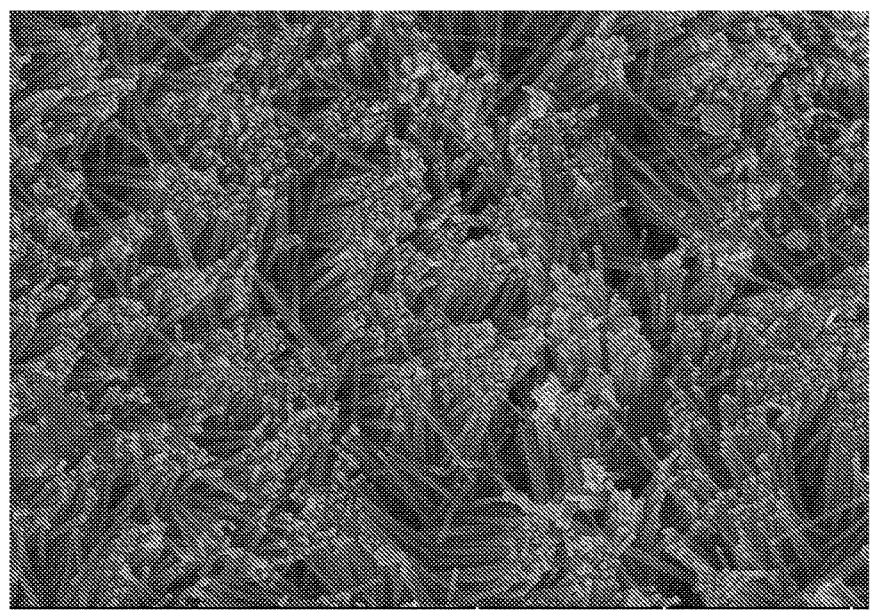
FIGS. 6-10 are scanning electron microscope (SEM) micrographs of an aligned assembly of nanowires according to embodiments.
Figure 7:
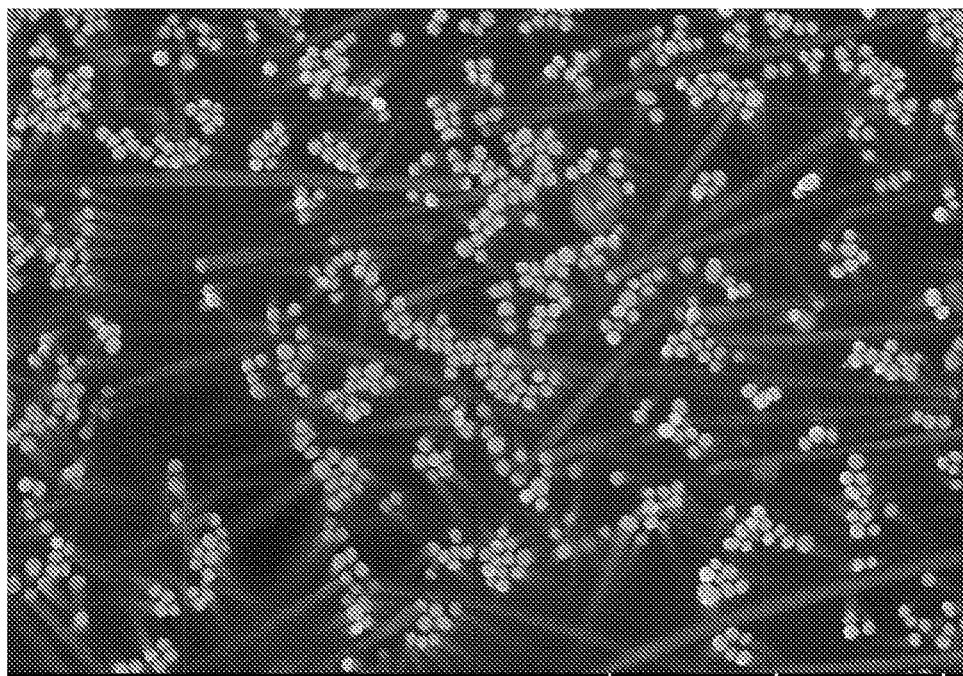
Figure 8:
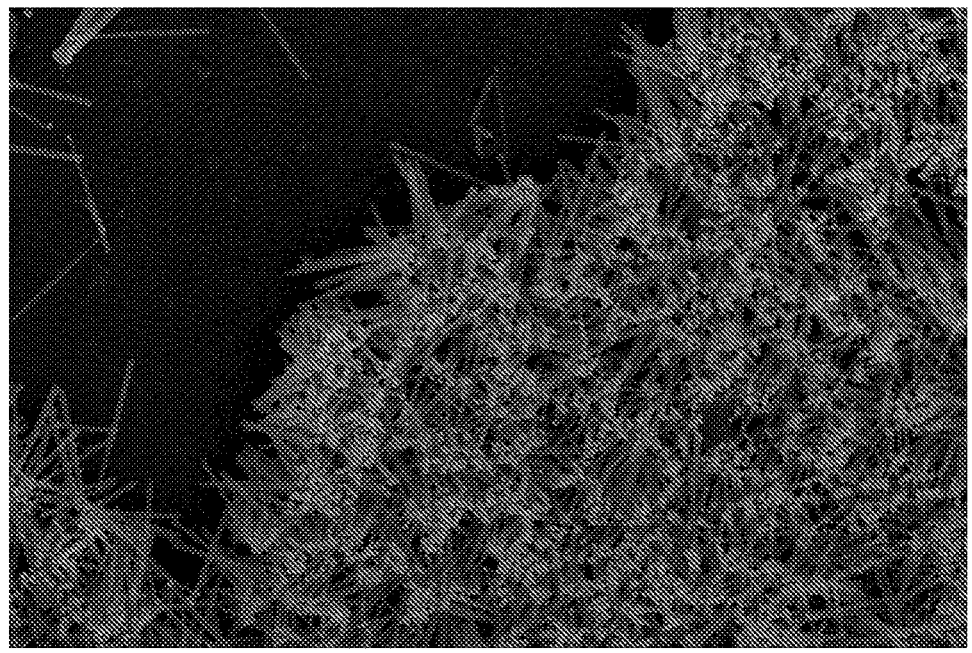
Figure 9:
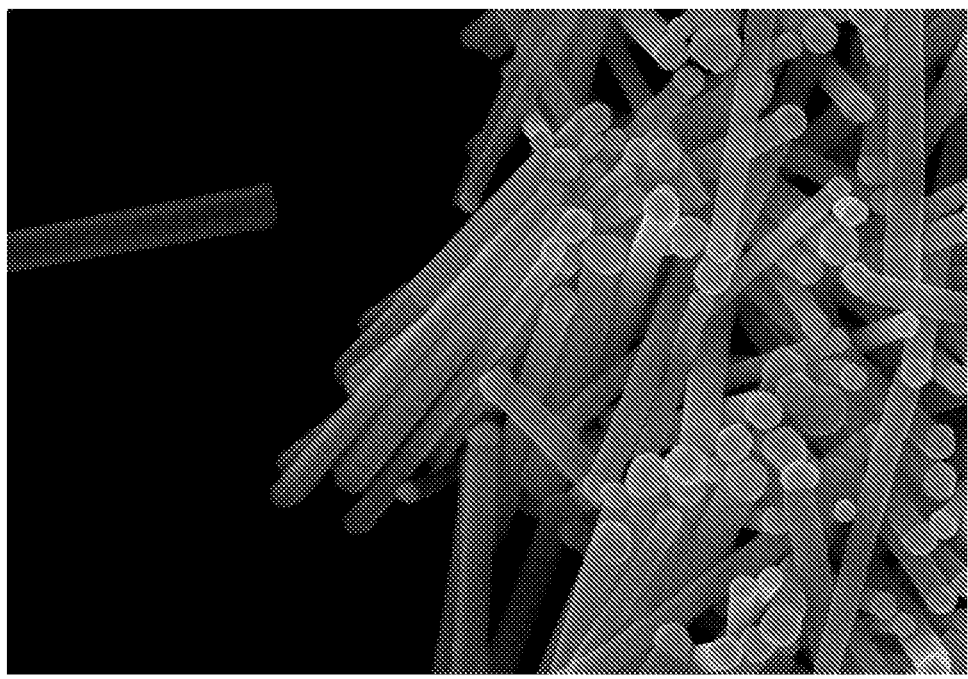
Figure 10:
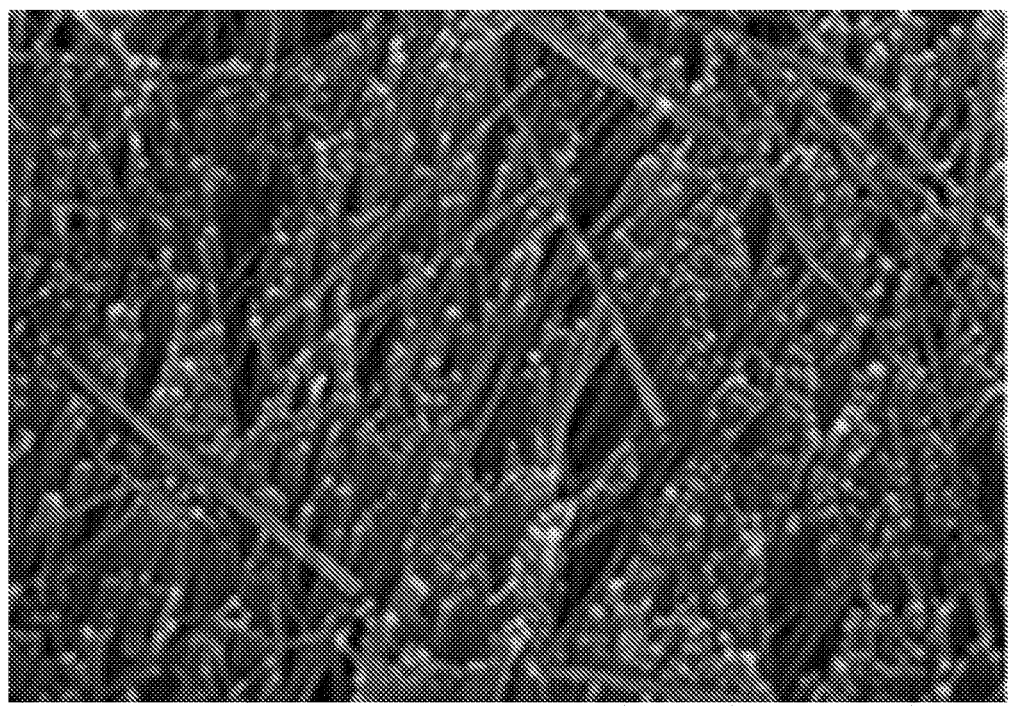

FIGS. 6-10 are SEM micrographs of nanowires aligned on a substrate according to embodiments described above. FIG. 6 is a micrograph illustrating nanowires made according to a method including optional step 5b illustrated in FIG. 1 and described above followed Langmuir-Schaefer capture. FIG. 7 illustrates an embodiment in which the capture surface 116A of the substrate 116 was functionalized with poly(ethylene imine) (PEI). FIGS. 8-10 illustrate an embodiment in which nanowires 108 were captured on a non-functionalized silicon substrate 116.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method for transferring an assembly of oriented nanowires from a liquid interface onto a surface, comprising:
   providing a first liquid and a second liquid, wherein the first and second liquids phase separate into a bottom phase, a top phase and an interface between the bottom phase and the top phase;
   providing nanowires comprising semiconductor nanowires in the first and second liquids such that the majority of the nanowires are located at the interface; and
   providing the nanowires from the interface located between the first and second liquids onto a substrate such that a majority of the nanowires are aligned with respect to each other on the substrate.

2. The method of claim 1, wherein at least 50% of the nanowires are oriented substantially unidirectionally with respect to the substrate.

3. The method of claim 1, wherein less than 50% of the nanowires are oriented substantially unidirectionally with respect to the interface but at least 50% of the nanowires are oriented substantially unidirectionally with respect to the substrate.

4. The method of 1, wherein a majority of the nanowires form an assembly of aligned nanowires at the interface between the first and second liquids, wherein the nanowires are oriented substantially unidirectionally with respect to the interface; and wherein:
   at least 70% of the nanowires are oriented substantially unidirectionally with respect to the interface; or
   at least 80% of the nanowires are oriented substantially unidirectionally with respect to the interface; or
   wherein the majority of the nanowires are oriented within 20° of perpendicular to the interface and wherein a minority of the nanowires not oriented substantially unidirectionally with respect to the interface are randomly oriented or aligned in a direction different from the unidirection of the majority of the nanowires; or
   further comprising promoting the formation of the assembly of nanowires by changing a composition of at least one of the first and the second liquids, changing a temperature of at least one of the first and the second liquids or allowing sufficient time to pass for the nanowires to assemble at the interface.

5. The method of claim 1, wherein the nanowires are dispersed in a dispersion liquid to form a nanowire dispersion; and wherein:
   the dispersion liquid is the same as either the first or the second liquid; or
   the nanowire dispersion is provided to the first liquid followed by adding the second liquid to the first liquid; or
   the nanowire dispersion is provided to the first liquid such that the nanowire dispersion liquid forms the second liquid; or
   the nanowire dispersion is provided into a container containing both the first and the second liquids.

6. The method of claim 1, wherein:
   the nanowires are aligned at the interface located between the first and second liquids and transferred in an aligned configuration from the interface to a capture surface of the substrate; and
   the nanowires are oriented with their longest axis substantially perpendicular to the capture surface of the substrate and comprise a nanoparticle on an end.

7. The method of claim 1, further comprising:
   functionalizing at least one end of the nanowires; or
   functionalizing both ends of the nanowires, wherein a first end of the nanowires is functionalized with a first compound and a second end of the nanowires is functionalized with a second compound different from the first compound, wherein the first compound is hydrophobic and the second compound is hydrophilic.

8. The method of claim 1, further comprising functionalizing the substrate with a functionalizing compound, wherein the substrate is functionalized with 1-octadecanethiol or polyethyleneimine; and wherein:
   each of the nanowires comprises a semiconductor nanowire having a metal catalyst particle on an upper end and the upper end of the nanowire containing the metal catalyst particle is functionalized with a first functionalizing compound that renders the upper end of the nanowire either hydrophobic or hydrophilic, wherein a lower end of the nanowire which is connected to the substrate is functionalized with a second functionalizing compound different from the first functionalizing compound, wherein the second functionalizing compound is hydrophobic if the first functionalizing compound is hydrophilic or wherein the second functionalizing compound is hydrophobic if the first functionalizing compound is hydrophobic, wherein the first functionalizing compound is 1-octadecanethiol and the second functionalizing compound is (12-phosphonododecyl)phosphonic acid; or the first liquid comprises an aqueous basic solution and the second liquid comprises cyclopentanone.

9. The method of claim 1, wherein the nanowires comprise a III-V or II-VI semiconductor.

10. The method of claim 1, further comprising adding a third liquid that solidifies and holds the nanowires at the interface.

11. The method of claim 1, further comprising incorporating the substrate containing the nanowires into a solar cell.

* * * * *